United States Patent
Kobayashi

(10) Patent No.: US 7,586,967 B2
(45) Date of Patent: Sep. 8, 2009

(54) SEMICONDUCTOR LASER AND METHOD OF MANUFACTURING THE SAME

(75) Inventor: Ryuji Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/580,683

(22) PCT Filed: Nov. 26, 2004

(86) PCT No.: PCT/JP2004/017576
§ 371 (c)(1),
(2), (4) Date: May 26, 2006

(87) PCT Pub. No.: WO2005/053126
PCT Pub. Date: Jun. 9, 2005

(65) Prior Publication Data
US 2007/0104236 A1 May 10, 2007

(30) Foreign Application Priority Data
Nov. 28, 2003 (JP) ............... 2003-398670

(51) Int. Cl.
*H01S 5/00* (2006.01)
(52) U.S. Cl. .............. 372/45.011; 372/43.01; 372/44.01; 372/45.01
(58) Field of Classification Search ............. 372/43.01, 372/44.01, 45.01, 45.011
See application file for complete search history.

(56) References Cited

U.S. PATENT DOCUMENTS

| 5,671,242 A | 9/1997 | Takiguchi et al. |
| 5,847,415 A * | 12/1998 | Sakata .................. 257/96 |
| 6,337,870 B1 | 1/2002 | Furushima |

FOREIGN PATENT DOCUMENTS

| JP | 8-78786 | 3/1996 |
| JP | 11-121858 | 4/1999 |
| JP | 2003-133647 | 5/2003 |

OTHER PUBLICATIONS

S. L. Chuang. Physics of Optoelectronic Devices. New York: John Wile & Sons, 1995.*
Y. Sakata et al. "All-Selective MOVPE-Grown 1.3-um Strained Multi-quantum-Well Buried-Heterostructure Laser Diodes," IEEE Journal of Quantum Electronics, vol. 35, No. 3, Mar. 1999.*

(Continued)

*Primary Examiner*—Minsun Harvey
*Assistant Examiner*—Xnning Niu
(74) *Attorney, Agent, or Firm*—Young & Thompson

(57) ABSTRACT

A semiconductor laser manufactured by selective MOVPE growth, in which the lattice relaxation of recombination layers grown on large width portions is suppressed, the leak current is suppressed, and the reliability is high. When a semiconductor layer is manufactured by selective MOVPE growth, a DH mesastripe (6) is epitaxially grown on a small width portion (14) which is a spacing of a silicon oxide mask (13). The average strain of the DH mesa stripe (6) is shifted to the compression strain side to an extent that lattice relaxation is not caused. As a result, the tensile strains of recombination layers (16) grown on large width portions (15) are mitigated.

20 Claims, 7 Drawing Sheets

OTHER PUBLICATIONS

G. P. Agrawal Semiconductor Lasers Past, Present, and Future. American Institute of Physics, 1995.*

Sakata, Y. et al., 'All-selective MOVPE-grown 1.3-μm strained multi-quantum-well buried-heterostructure laser diodes', In: IEEE Journal of Quantum Electronics, vol. 35, 3$^{rd}$ issue, Mar. 1999, pp. 368 to 376.

Wang, M.C. et al., 'Ultrahigh temperature and ultrahigh speed operation of 1.3 μm strain-compensated AlGaInAs/InP uncooled laser diodes', In: Electronics Letters, vol. 31, 18$^{th}$ issue, Aug. 31, 1995, pp. 1584 to 1585.

Tsuchiya, T. et al., 'Large number of periods in highly strained InGaAlAs/InGaAlAs MQW structures grown by metalorganic vapor-phase epitaxy', International Conference on Indium Phosphide and Related Materials, Technical Summary, p. 47, MoB1-2, May 16, 1999.

Electronics Letters vol. 27, No. 14, pp. 1268 to 1270, 1991.

Miller, B.I. et al., 'Strain-compensated strained-layer superlattices for 1.5 μm wavelength lasers', Applied Physics Letters vol. 58, pp. 1952 to 1954, 1991.

Electronics Materials, pp. 32 to 36, Nov. 1991.

Sakata, Y. et al., 'Selective MOVPE Growth to InGaAsP and InGaAs Using TBA and TBP', Journal of Electronic Materials vol. 25, No. 3, pp. 401 to 406, 1996.

Minch, J. et al., Theory and Experiment of $In_{1-x}Ga_xAs_yP_{1-y}$ and $In_{1-x-y}Ga_xAl_yAs$ Long-Wavelength Strained Quantum-Well Lasers, IEEE Journal of Quantum Electronics vol. 35, pp. 771 to 782, 1992.

Matthews, J.W. et al., 'Defects in epitaxial multilayers', Journal Crystal Growth vol. 27, pp. 118 to 125, 1974.

* cited by examiner

SEMICONDUCTOR LASER AND METHOD OF MANUFACTURING THE SAME

TECHNICAL FIELD

The present invention relates to a semiconductor laser and a method of manufacturing the same and, more particularly, to a semiconductor laser in which a light guide by selective growth and a method of manufacturing the same.

BACKGROUND ART

It is known that a laser characteristic is improved such that a quantum well active layer is strained to transform a valence band structure. However, when strain the amount of which is larger than a critical strain amount is introduced, dislocation occurs by relaxation of the strain to deteriorate the reliability of a semiconductor laser. For this reason, a strain-compensation type quantum well structure which introduces strain having a direction opposing that of a well layer to a barrier layer to prevent an average strain amount from exceeding a critical strain amount is proposed. It is reported in Non-patent Document 1, Non-patent Document 2, or Non-patent Document 3 that, in the strain-compensation type quantum well structure, an optical characteristic of a quantum well and a characteristic of a semiconductor layer are preferable at a position where an average strain amount is almost zero.

An average strain amount $\epsilon$ (average) is defined by the following equation:

$$\varepsilon(\text{average}) = \frac{\sum_{i=1}^{n}(\varepsilon i \times di)}{d} \quad \text{[Equation 1]}$$

$$d = \sum_{i=1}^{n} di$$

The number of strained semiconductor layers is set at j, and the number of unstrained semiconductor layers sandwiched by the strained semiconductor layers is set at k. In a double hetero mesa-stripe or a recombination layer obtained by stacking n (n=j+k) semiconductor layers, a strain amount of an i-th semiconductor layer is represented by $\epsilon$ i, and the thickness of the i-th semiconductor layer is represented by di.

On the other hand, a semiconductor laser (ASM-LD: All Selective MOVPE grown Laser Diode) obtained by all selective MOVPE (Metal-Organic Vapor Phase Epitaxy) growth is characterized in that a buried heterostructure (BH) can be manufactured without an etching process.

FIG. 8 shows a structural diagram of an ASM-LD described in Non-patent Document 4. A double hetero mesa-stripe 6 (to be referred to as a DH mesa-stripe hereinafter) including a strained multiple quantum well active layer 3a is formed on an n-type InP substrate 1 having the (001) plane as a growing surface, and the double hetero mesa-stripe 6 is buried with a p-type InP current blocking layer 7 and an n-type InP current blocking layer 8. On these layers, a p-type InP cladding layer 9 and a p-type InGaAs contact layer 10 are formed. In order to reduce a parasitic capacitance, at predetermined positions on both the sides of the DH mesa-stripe 6, two grooves reaching the n-type InP substrate 1 are formed to separate a ridge portion region including the DH mesa-stripe 6 from both the sides thereof. An n-type electrode 11 is formed on the lower surface of the resultant structure, and a p-type electrode 12 connected through an opening formed in an insulating film is formed on the upper surface of the resultant structure.

Manufacturing steps are shown in FIG. 9. Two stripe-shaped silicon oxide masks 13 (mask width: 5 μm) are formed along the [110] direction on the n-type InP substrate 1 having the (001) plane as a growing surface. In this case, since the two silicon oxide masks 13 serve as growth-blocking masks in selective growth, a narrow portion 14 sandwiched between the two silicon oxide masks 13 and broad portions 15 on both the outsides of the two silicon oxide masks 13 serve as regions which can be selectively grown (FIG. 9(a)).

In the narrow portion 14, the DH mesa-stripe 6 serving as a first semiconductor layered product constituted by an n-type InP buffer layer 18, a strained multiple quantum well active layer 3a, and a p-type InP cap layer 5 is manufactured. In the selective MOVPE growth, at the same time, a recombination layer 16 serving as a second semiconductor laminated product is formed in the broad portion 15 (FIG. 9(b)).

A new silicon oxide mask 17 is formed on only the top of the DH mesa-stripe 6 by a self-alignment process (FIG. 9(c)), and the p-type InP current blocking layer 7 and the n-type InP current blocking layer 8 are selectively grown using the silicon oxide mask 17. After the silicon oxide film 17 is removed, the p-type InP cladding layer 9 and the p-type InGaAs contact layer 10 are grown (FIG. 9(e)). Thereafter, two grooves reaching the n-type InP substrate are formed, and an n-type electrode on the lower surface and a p-type electrode on the upper surface are formed, so that a semiconductor laser is completed.

Non-patent Document 1: International Conference on Indium Phosphide and Related Materials, Technical Summary, p. 47 to 50, MoB1-2, May 16, 1999

Non-patent Document 2: Electronics Letters Vol. 27, No. 14, pp. 1268 to 1270, 1991

Non-patent Document 3: Applied Physics Letters Vol. 58, pp. 1952 to 1954, 1991

Non-patent Document 4: Electronic Materials, pp. 32 to 36, November, 1999

Non-patent Document 5: Journal of Electronic Materials Vol. 25, No. 3, pp. 401 to 406, 1996

Non-patent Document 6: IEEE Journal of Quantum Electronics Vol. 35, pp. 771 to 782, 1999

Non-patent Document 7: Journal of Crystal Growth Vol. 27, pp. 118 to 125, 1974

DISCLOSURE OF THE INVENTION

An interval between adjacent semiconductor laser element units is set at about 500 μm in an ASM-LD, as shown in FIG. 10, the broad portions 15 each having a width of about 490 μm are formed on both the outsides of the pair of silicon oxide masks 13. For this reason, when a DH mesa-stripe serving as a first semiconductor laminated product including a quantum wall active layer is grown on the narrow portion 14, at the same time, a recombination layer serving as a second semiconductor laminated product having a composition and a thickness which are different from those of the DH mesa-stripe is also formed in the broad portion 15. This portion, as shown in FIG. 9(e), the recombination layer 16 having a bandgap smaller than that of InP is inserted into a current blocking layer constituted by a pnpn thyrister structure of InP. Carriers functioning as a gate current of the pnpn thyrister are recombined to each other in the layer to reduce a current gain of an npn transistor constituting the thyrister. As a result, the thyrister is suppressed from being turned on, and a current block characteristic is improved.

However, when the DH mesa-stripe 6 to be selectively grown on the narrow portion is grown such that an average strain amount $\varepsilon$ 1 (average) is zero strain ($\varepsilon$ 1 (average)=0), an average strain amount $\varepsilon$ 2 (average) of the recombination layer 16 formed in the broad portion is a tensile strain ($\varepsilon$ 2 (average)<0), and the average strain amount $\varepsilon$ 2 (average) exceeds a critical strain amount $\varepsilon$ 2 (critical). As a result, dislocation caused by lattice relaxation occurs, and deterioration of a laser characteristic and dislocation caused by an increase in leak current extend over the quantum well active layer 3a to concern deterioration of the reliability.

According to the present invention, there is provided a semiconductor layer having a double hetero mesa-stripe serving as a first semiconductor laminated product including at least a quantum well active layer formed by selective growth on a semiconductor substrate, and recombination layers serving as second semiconductor laminated products simultaneously formed on both the sides of the double hetero mesa-stripe at a predetermined interval in the selective growth, wherein when an average strain amount $\varepsilon$ (average) and a critical strain amount $\varepsilon$ (critical) are defined by the following equations:

$$\varepsilon(\text{average}) = \frac{\sum_{i=1}^{n}(\varepsilon i \times di)}{d} \qquad \text{[Equation 2]}$$

$$d = \sum_{i=1}^{n} di$$

where the number of strained semiconductor layers is represented by j, the number of unstrained semiconductor layers sandwiched by the strained semiconductor layers is represented by k, and a strain amount of an i-th semiconductor layer and a thickness of the i-th semiconductor layer in the double hetero mesa-stripe or the recombined layers obtained by laminating n (n=j+k) semiconductor layers are represented by $\varepsilon$ i and di, respectively, $$\varepsilon(\text{critical}) = \qquad \text{[Equation 3]}$$

$$\frac{b}{4\pi d(\text{critical})} \cdot \frac{1 - p \cdot (\cos\alpha)^{\wedge}2}{(1+p) \cdot \cos\lambda} \cdot \left\{\ln\left(\frac{d(\text{critical})}{b}\right) + 1\right\}$$

where
b: Strength of Burgers vector,
p: Poisson's ratio
$\alpha$: angle between a dislocation line and its Burgers vector
$\lambda$: angle between a slip direction and a direction perpendicular to cross lines of a slip surface and a laminate surface and being in the laminate surface, an average strain amount $\varepsilon$ 1 (average) of the double hetero mesa-stripe is a compression strain ($\varepsilon$ 1 (critical)$\geqq$$\varepsilon$ 1 (average)>0, and an average strain amount $\varepsilon$2 (average) of the recombined layer is a tensile strain ($-\varepsilon$ 2 (critical)$\leqq$$\varepsilon$ 2 (average)<0) not more than a critical strain amount $\varepsilon$ 2 (critical) or zero strain ($\varepsilon$2 (average)=0).

The above-described definition equations of the critical strain amount are described in Non-patent Document 7.

According to the present invention, there is provided a method of manufacturing a semiconductor laser including: the step of forming a pair of stripe-shaped dielectric masks on a semiconductor substrate, the step of forming a double hetero mesa-stripe serving as a first semiconductor laminated product including an active layer in a narrow portion sandwiched by the dielectric masks, and the step of, at the same time, forming recombined layers serving as second semiconductor laminated products in broad portions on both the outsides of the dielectric masks, wherein when an average strain amount $\varepsilon$ (average) and a critical strain amount $\varepsilon$ (critical) are defined by the following equations:

$$\varepsilon(\text{average}) = \frac{\sum_{i=1}^{n}(\varepsilon i \times di)}{d} \qquad \text{[Equation 4]}$$

$$d = \sum_{i=1}^{n} di$$

where the number of strained semiconductor layers is represented by j, the number of unstrained semiconductor layers sandwiched by the strained semiconductor layers is represented by k, and a strain amount of an i-th semiconductor layer and a thickness of the i-th semiconductor layer in the double hetero mesa-stripe or the recombined layers obtained by laminating n (n=j+k) semiconductor layers are represented by $\varepsilon$ i and di, respectively, $$\varepsilon(\text{critical}) = \qquad \text{[Equation 5]}$$

$$\frac{b}{4\pi d(\text{critical})} \cdot \frac{1 - p \cdot (\cos\alpha)^{\wedge}2}{(1+p) \cdot \cos\lambda} \cdot \left\{\ln\left(\frac{d(\text{critical})}{b}\right) + 1\right\}$$

where
b: Strength of Burgers vector,
p: Poisson's ratio
$\alpha$: angle between a dislocation line and its Burgers vector
$\lambda$: angle between a slip direction and a direction perpendicular to cross lines of a slip surface and a laminate surface and being in the laminate surface, an average strain amount $\varepsilon$ 1 (average) of the double hetero mesa-stripe is a compression strain ($\varepsilon$ 1 (critical)$\geqq$$\varepsilon$ 1 (average)>0, and an average strain amount $\varepsilon$ 2 (average) of the recombined layer is a tensile strain ($-\varepsilon$ 2 (critical)$\leqq$$\varepsilon$ 2 (average)<0) not more than a critical strain amount $\varepsilon$ 2 (critical) or zero strain ($\varepsilon$ 2 (average)=0).

(Operation)

FIG. 11 is a schematic diagram showing a mechanism of selective growth described in Non-patent Document 5.

When a semiconductor layer containing Al, Ga, and In is selectively grown, the composition and the thickness of the narrow portion 14 are determined by supplying growing species by (1) gaseous diffusion in a vertical direction, (2) gaseous diffusion in a horizontal direction, and (3) migration from the surface of the dielectric mask. On the other hand, to the broad portion 15, growing species are supplied by (1) gaseous diffusion in a vertical direction mainly. Since a diffusion length of In growing species is larger than diffusion lengths of Al and Ga growing species, In composition of the growth layer of the narrow portion 14 is excessive more than that of the growth layer of the broad portion 15, and a layer thickness of the narrow portion 14 is larger than that of the broad portion 15 (d>d0). Therefore, when the DH mesa-stripe 6 to be grown on the narrow portion is grown such that the average strain amount $\epsilon$ 1 (average) is zero strain ($\epsilon$ 1 (average)=0), the average strain amount $\epsilon$ 2 (average) of the recombination layer 16 grown on the broad portion 15 becomes a tensile strain ($\epsilon$ 2 (average)<0) because of a small In composition. Depending on a growing condition, the average strain amount $\epsilon$ 2 (average) of the recombination layer 16 exceeds the critical strain amount $\epsilon$ 2 (critical) (–$\epsilon$ 2 (critical)>$\epsilon$ 2 (average)), lattice relaxation occurs. For this reason, the average strain amount $\epsilon$ 1 (average) of the DH mesa-stripe 6 is shifted to a compressive strain side within the critical strain amount $\epsilon$ 2 (critical), so that a tensile strain of the recombination layer 16 can be reduced. As a result, the average strain amount $\epsilon$ 2 (average) of the recombination layer 16 on the broad portion can be suppressed within the critical strain amount $\epsilon$ 2 (critical), and dislocation caused by lattice relaxation can be suppressed from occurring.

According to the present invention, when the average strain amount $\epsilon$ 1 (average) of the double hetero mesa-stripe is shifted to the compressive strain side within the critical strain amount $\epsilon$ 2 (critical), tensile strain amounts $\epsilon$ 2 (average) of recombination layers simultaneously formed on both the sides of the double hetero mesa-stripe at a predetermined interval can be reduced within the critical strain amount $\epsilon$ 2 (critical). As a result, lattice relaxation of the recombination layer can be suppressed, and a highly-reliable semiconductor laser the leak current of which is suppressed can be realized.

BEST MODE FOR CARRYING OUT THE INVENTION

First Embodiment

Figure 1:
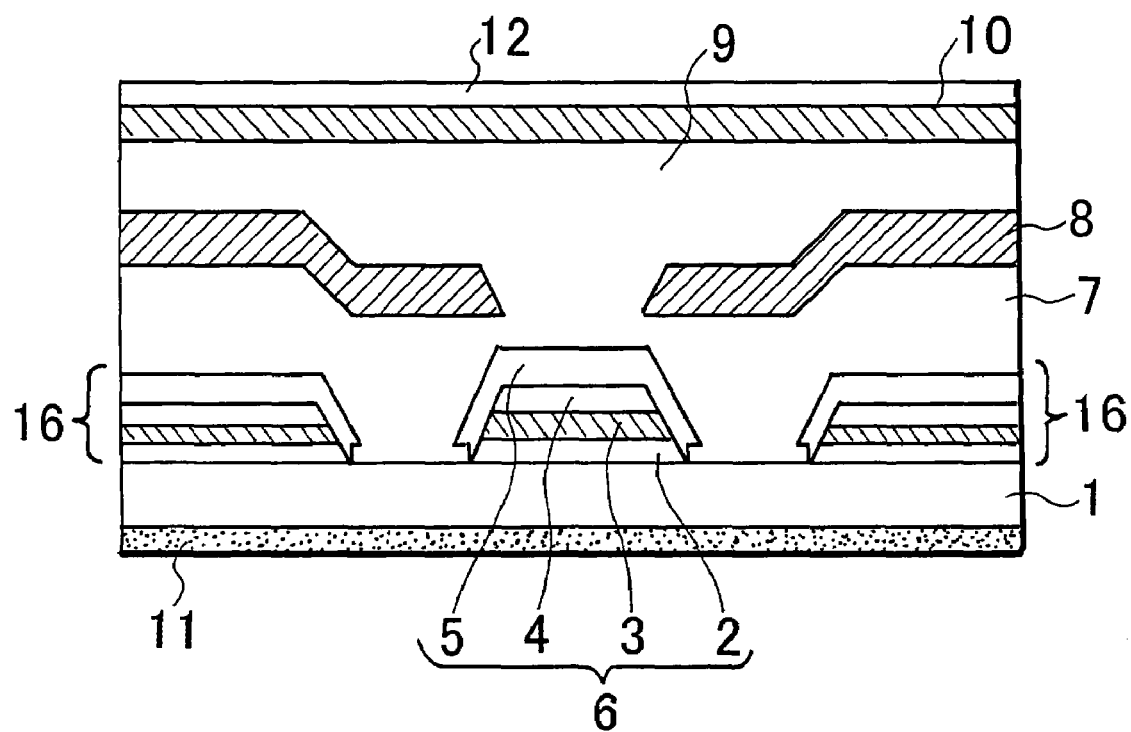
FIG. 1 is a cross-sectional structural diagram of a semiconductor laser according to a first embodiment of the present invention.

FIG. 1 is a cross-sectional structural diagram of a semiconductor laser according to a first embodiment of the present invention.

On an n-type InP (001) substrate 1 (carrier concentration n=$2\times10^{18}$ cm$^{-3}$), a double hetero mesa-stripe 6 (to be referred to as a DH mesa-stripe hereinafter) serving as a first semiconductor laminated product constituted by an n-type AlGaInAs optical confinement layer 2 (thickness d=40 nm, zero strain, n=$1\times10^{18}$ cm$^{-3}$), a strain-compensation type multiple quantum well active layer 3 in which a well layer (d=6 nm, strain amount $\epsilon$=+1.4%, the number of wells=10), a barrier layer (d=10 nm, $\epsilon$=–0.6%, the number of barriers Nb=9) constitute an AlGaInAs layer, a p-type AlGaInAs optical confinement layer 4 (d=40 nm, zero strain, carrier concentration p=$1\times10^{18}$ cm$^{-3}$), and a p-type InP cap layer 5 (d=300 nm, p=$1\times10^{18}$ cm$^{-3}$) is formed. The DH mesa-stripe 6 is buried by a p-type InP current blocking layer 7 (d=600 nm, p=$5\times10^{17}$ cm$^{-3}$) and an n-type InP current blocking layer 8 (d=600 nm, p=$1\times10^{18}$ cm$^{-3}$). On these layers, a p-type InP cladding layer 9 (d=1600 nm, p=$1\times10^{18}$ cm$^{-3}$) and a p-type InGaAs contact layer 10 (d=300 nm, zero strain, p=$1\times10^{19}$ cm$^{-3}$) are formed, an n-side electrode 11 is formed on the lower surface, and a p-side electrode 12 is formed on the upper surface. Recombination layers 16 serving as second semiconductor laminated products are formed on both the sides of the DH mesa-stripe 6 at a predetermined interval.

Manufacturing processes are shown in FIG. 2.

MOVPE method is used in crystal growth, and trimethyl aluminum (TMAl), trimethyl gallium (TMGa), trimethyl indium (TMIn), arsine (AsH$_3$), and phosphine (PH$_3$) are used as materials. As n-type and p-type doping materials, disilane (Si$_2$H$_6$) and dimethyl zinc (DMZn) are used, respectively. A carrier gas is hydrogen, and the growth is performed at a growth pressure of 100 hPa.

A silicon oxide film having a thickness of 100 nm is deposited by thermal CVD on the n-type InP substrate 1 having the (001) plane as a growing surface. By using a general photolithography technique, the silicon oxide film is processed into a pair of stripe-shaped silicon oxide masks 13 each having a width of 5 µm and an opening width of 1.6 µm in a narrow portion 14. In this case, since the two silicon oxide masks 13 serve as growth-blocking masks in selective growth, the narrow portion 14 sandwiched by the two silicon oxide masks 13 and broad portions 15 on both the outsides of the silicon oxide masks 13 serve as regions in which selective growth can be performed (FIG. 2(a)). The direction of the stripes is the [110] direction. Since an element interval (interval between adjacent narrow portions) (not shown) between adjacent semiconductor layers is set at 500 µm, the width of a broad portion 1 is about 488 µm.

The n-type InP substrate 1 is set in an MOVPE apparatus (not shown), and the DH mesa-stripe 6 constituted by the n-type AlGaInAs optical confinement layer 2, the strain-compensation type multiple quantum well active layer 3, the p-type AlGaInAs optical confinement layer 4, and the p-type InP cap layer 5 is formed by selective growth.

At this time, a growth rate of the p-type InP cap layer 5 on the (111)B plane is increased, the (111)B planes of the n-type AlGaInAs optical confinement layer 2, the strain-compensation type multiple quantum well active layer 3, and the p-side AlGaInAs optical confinement layer 4 are covered with the p-type InP cap layer 5. Even though the substrate is exposed to the atmospheric air in the later process, a layer containing Al is suppressed from being oxidized.

Simultaneously with the selective MOVPE growth, the recombination layers 16 serving as semiconductor laminated products corresponding to the n-type AlGaInAs optical confinement layer 2, the strain-compensation type multiple quantum well active layer 3, the p-side AlGaInAs optical confinement layer 4, and the p-type InP cap layer 5 which are grown on the narrow portion 14 are also grown on the broad portions. However, the compositions and thicknesses of the respective growth layers are different from each other (FIG. 2(b)).

Figure 2A:
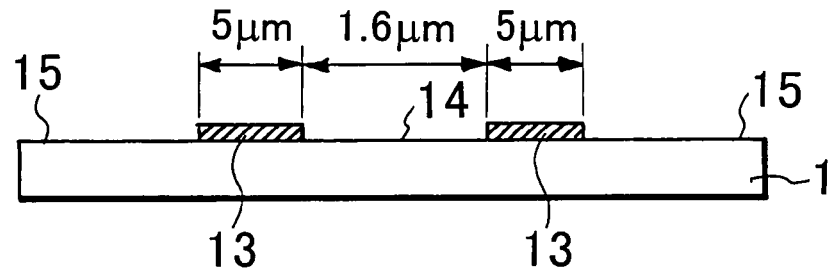
FIG. 2 includes process diagrams showing a method of manufacturing a semiconductor laser according to the first embodiment of the present invention.
Figure 2B:
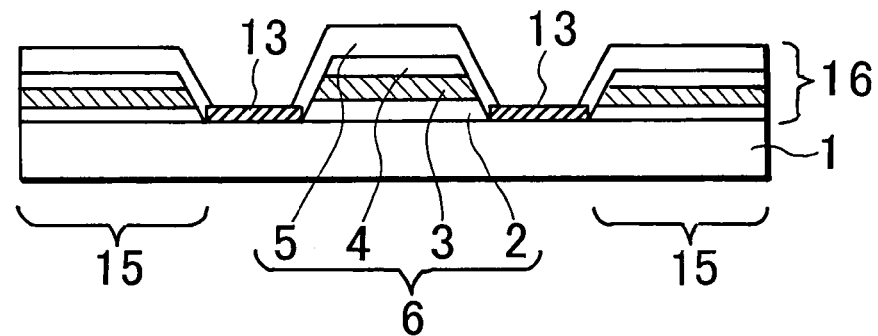
Figure 2C:
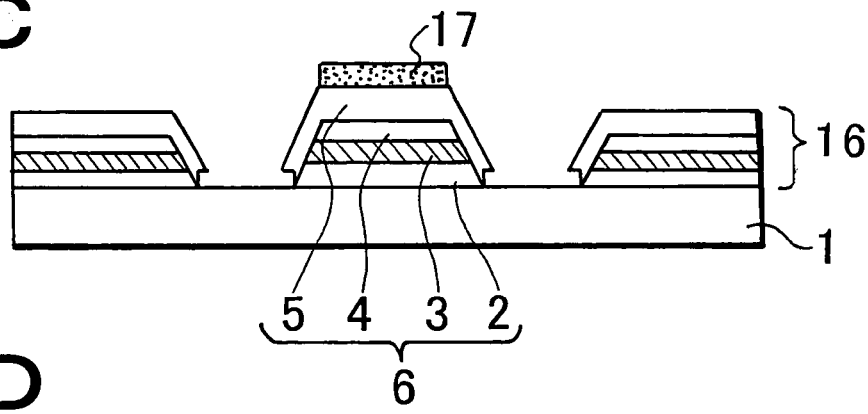

Thereafter, the resultant structure is removed from the MOVPE apparatus (not shown), and the silicon oxide film 17 is formed on only a mesa top by a self-alignment process (FIG. 2(c)).

Figure 2D:
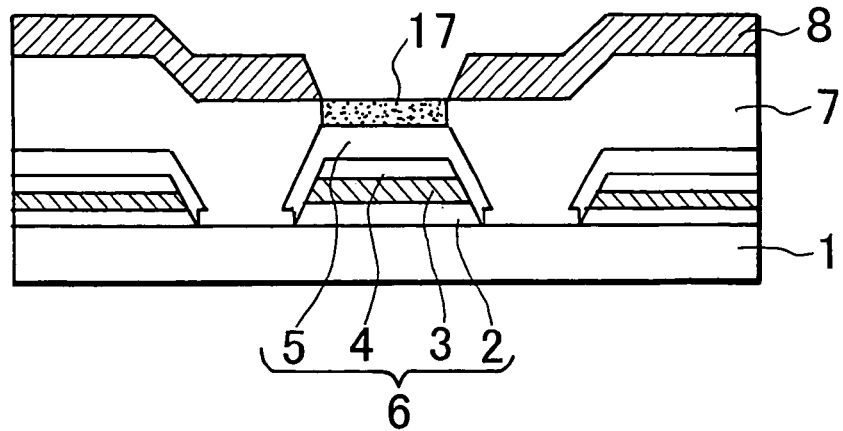

The structure is set in the MOVPE apparatus (not shown) again, the p-type InP current blocking layer 7 and the n-type InP current blocking layer 8 are formed by selective growth (FIG. 2(d)). Thereafter, the resultant structure is removed from the MOVPE apparatus (not shown), the silicon oxide mask is removed, and the p-type InP cladding layer 9 and the p-type InGaAs contact layer 10 are grown by a third MOVPE growth. Therefore, polishing of the n-type InP substrate 1 and formation of the n-side electrode 11 and the p-side electrode 12 are performed to make it possible to manufacture a semiconductor laser as shown in FIG. 1.

A characteristic feature of the first embodiment is that an average strain amount $\epsilon$ 1 (average) of the DH mesa-stripe 6 is shifted to a compression-strain side within a critical strain amount $\epsilon$ 1 (critical) to reduce a tensile strain amount $\epsilon$ 2 (average) of the recombination layer 16 on the broad portion and to suppress lattice relaxation. The results are shown in FIGS. 3 and 4.

Figure 3:
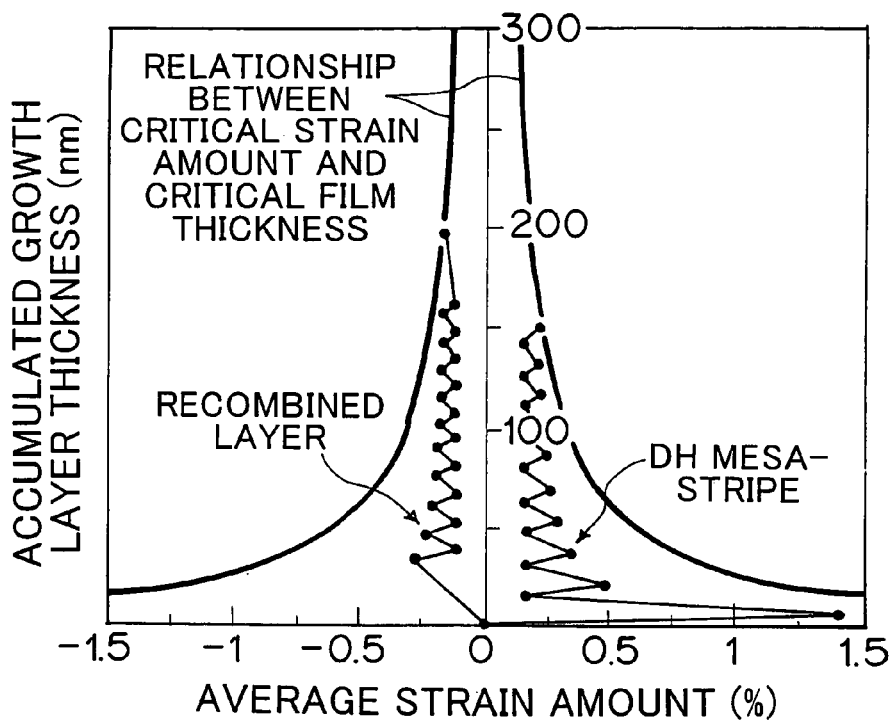
FIG. 3 is a calculation result showing a relationship between an average strain amount of a strained growth layer and a growth layer thickness with respect to a DH mesa-stripe and a recombination layer of a broad portion in the first embodiment of the present invention.
Figure 4:
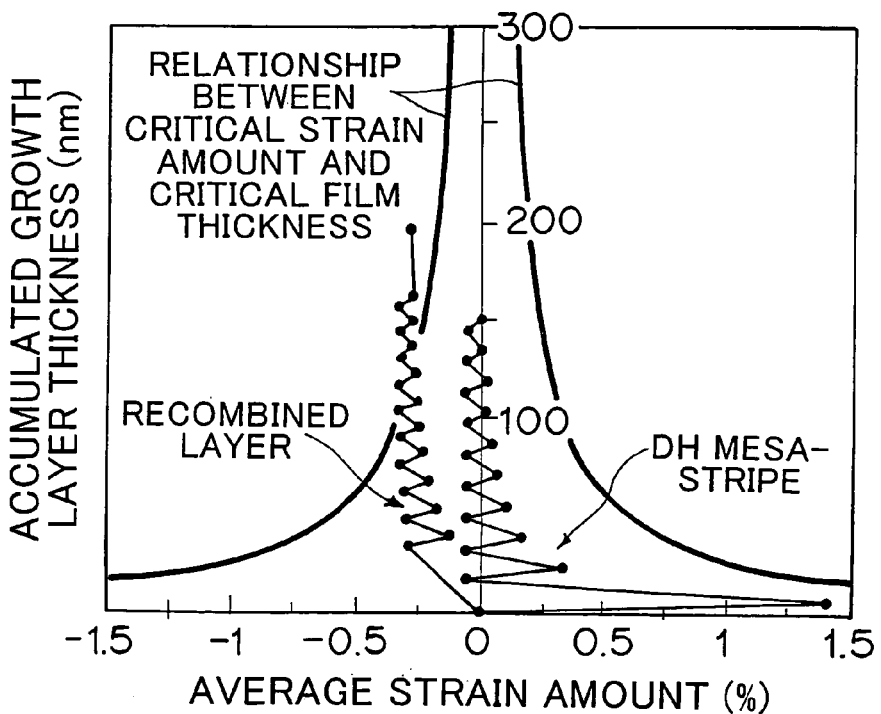
FIG. 4 is a calculation result showing a relationship between an average strain amount of a strained growth layer and a growth layer thickness with respect to a DH mesa-stripe and a recombination layer of a broad portion in a semiconductor laser in which an average strain amount of the DH mesa-stripe is zero.

FIGS. 3 and 4 are calculation results of relationships between average strain amounts of strained growth layers and growth layer thicknesses with respect to the DH mesa-stripe 6 and the recombination layer 16. Points indicated by black solid circles denote average strain amounts (%) and total thickness (nm) of grown layer after the semiconductor layers are sequentially grown, and show results of growth from a first layer of strained growth layers to a final strained growth layer.

In the first embodiment, in the DH mesa-stripe 6, a well layer and a barrier layer are strained growth layers. In the recombination layer 16, semiconductor layers corresponding to the optical confinement layers 2 and 4, the well layer, and the barrier layer are strained growth layers. For reference, a relationship between a critical strain amount and a critical film thickness is indicated by a solid line. In growth up to the strained final layer, a black solid circle indicated by the average strain amount and the total thickness of grown layer is above the solid line, it is shown that the strain amount and thickness of the growth layer exceed the critical strain amount and the critical layer thickness, respectively. Dislocation may occur due to relaxation of strain. FIG. 3 is a calculation result of the structure of the present invention shown in the first embodiment. FIG. 4 is a calculation result of a structure in which a strain amount of a barrier layer is set at –0.93% to make the average strain amount $\epsilon$ 1 (average) in the DH mesa-stripe almost zero strain ($\epsilon$ 1 (average)=0) as described in Non-patent Documents 1 to 3 in the structure of the present invention shown in the first embodiment. In this case, as shown in FIG. 4, when the average strain amount $\epsilon$ 1 (average) of the DH mesa stripe is made almost zero strain ($\epsilon$ 1 (average)=0), the average strain amount $\epsilon$ 2 (average) of the recombination layer exceeds a critical strain amount on a tensile strain side, and dislocation may be caused by lattice relaxation. However, in contrast to this, in FIG. 3 (structure of the present invention), the average strain amount $\epsilon$ 1 (average) in the DH mesa-stripe shifts to a compression-strain side. Accordingly, the average strain amount $\epsilon$ 2 (average) of the recombination layer decreases (shift to the right in FIG. 3). As a result, it is understood that both the average strain amount $\epsilon$ 1 (average) of the DH mesa-stripe and the average strain amount $\epsilon$ 2 (average) of the recombined layer do not exceed the critical strain amount.

Control of strain can be performed by changing amounts of supplied materials.

In the AlGaInAs layer used in the first embodiment, an amount of supplied TMIn is increased or amounts of supplied TMAl and TEGa are reduced to increase an In composition of the growth layers, so that compression strain can be achieved. In contrast to this, the amount of supplied TMIn is reduced or the amounts of supplied TMAl and TEGa are increased to reduce the In composition of the growth layers, so that tensile strain can be achieved. However, when only the In composition is simply changed, a strain amount and a bandgap also change. In a wall of the quantum well active layer, the bandgap changes to change an oscillation wavelength of a laser. Therefore, the In composition is changed to change the strain amount, and an Al or Ga composition must be changed to prevent the bandgap from changing.

As an example, the following table shows compositions calculated by a composition dependency of an AlGaInAs bandgap described in Non-patent Document 6 and a lattice constant of a binary semiconductor and obtained in a zero-strain state and –0.6% tensile strain state in AlGaInAs having a wavelength of 1 μm.

TABLE 1

Composition of AlGaInAs layer having wavelength of 1 μm and having zero strain and –0.6% tensile strain

| $Al_xGa_yIn_zAs$ | Al composition: X | Ga composition: Y | In composition: Z |
| --- | --- | --- | --- |
| Zero strain, Wavelength: 1 μm | 0.347 | 0.127 | 0.526 |
| –0.6% tensile strain, Wavelength: 1 μm | 0.338 | 0.223 | 0.439 |

Second Embodiment

Figure 5:
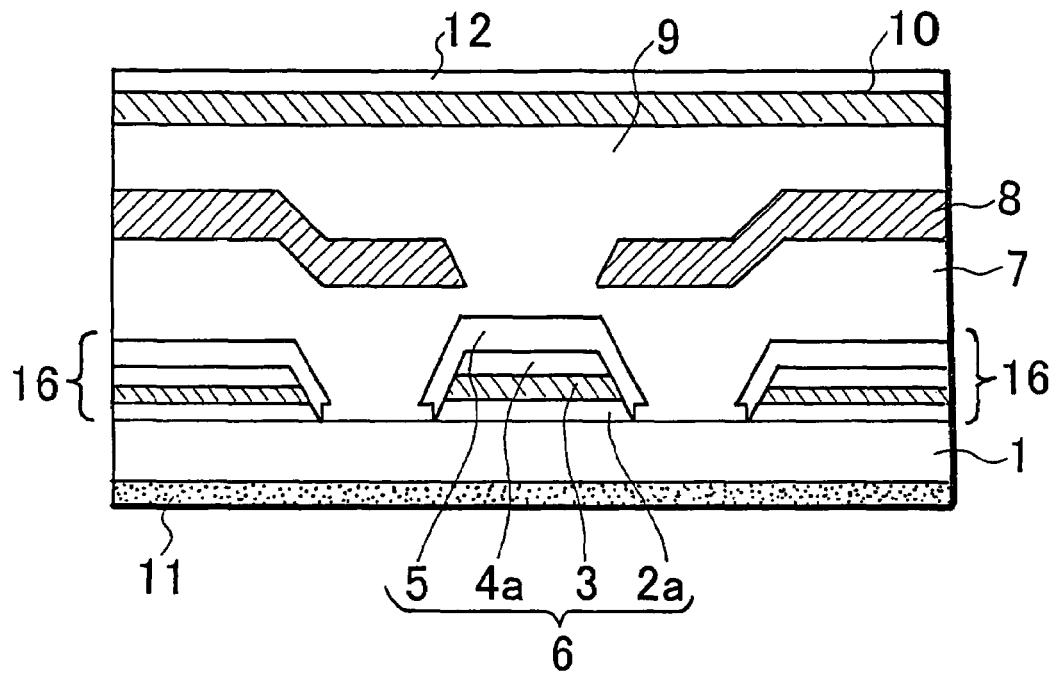
FIG. 5 is a cross-sectional structural diagram of a semiconductor laser according to a second embodiment of the present invention.

FIG. 5 shows a cross-sectional structure of a semiconductor laser according to a second embodiment of the present invention.

On an n-type InP (001) substrate 1 (carrier concentration $n=2\times10^{18}$ $cm^{-3}$), a DH mesa-stripe 6 serving as a first semiconductor laminated product constituted by an n-type AlGaInAs strained optical confinement layer 2 (thickness d=40 nm, strain amount $\epsilon=+0.31\%$, $n=1\times10^{18}$ $cm^{-3}$), a strain-compensation type multiple quantum well active layer 3 in which a well layer (d=6 nm, $\epsilon=+1.4\%$, the number of wells=10), a barrier layer (d=10 nm, $\epsilon=-0.93\%$, the number of barriers Nb=9) constitute an AlGaInAs layer, a p-type AlGaInAs strained optical confinement layer 4 (d=40 nm, $\epsilon=+0.31\%$, carrier concentration $p=1\times10^{18}$ $cm^{-3}$), and a p-type InP cap layer 5 (d=300 nm, p=1×10$^{18}$ cm$^{-3}$) is formed. The DH mesa-stripe 6 is buried by a p-type InP current blocking layer 7 (d=600 nm, p=5×10$^{17}$ cm$^{-3}$) and an n-type InP current blocking layer 8 (d=600 nm, p=1×10$^{18}$ cm$^{-3}$). A p-type InP cladding layer 9 (d=1600 nm, p=1×10$^{18}$ cm$^{-3}$) and a p-type InGaAs contact layer 10 (d=300 nm, zero strain, p=1×10$^{19}$ cm$^{-3}$) are formed, an n-side electrode 11 is formed on the lower surface, and a p-side electrode 12 is formed on the upper surface. Recombination layers 16 serving as second semiconductor laminated products are formed on both the sides of the DH mesa-stripe 6 at a predetermined interval.

In this case, the second embodiment is different from the first embodiment in that the amount of the barrier layer is increased from −0.6% to −0.93% and that the strain amounts of the light-confining layers 2a and 4a are changed from zero strain to a compression strain of +0.31%. In this manner, the tensile strain amount of the barrier layer is increased to make the average strain amount of the strain-compensation type multiple quantum well active layer 3 almost zero, and the optical confinement layers 2a and 4a are newly compression-strained to suppress the average strain amount $\epsilon$ 1 (average) of the DH mesa-stripe 6 and the average strain amount $\epsilon$ 2 (average) of the recombination layer 16 to a critical strain amount or less.

Figure 6:
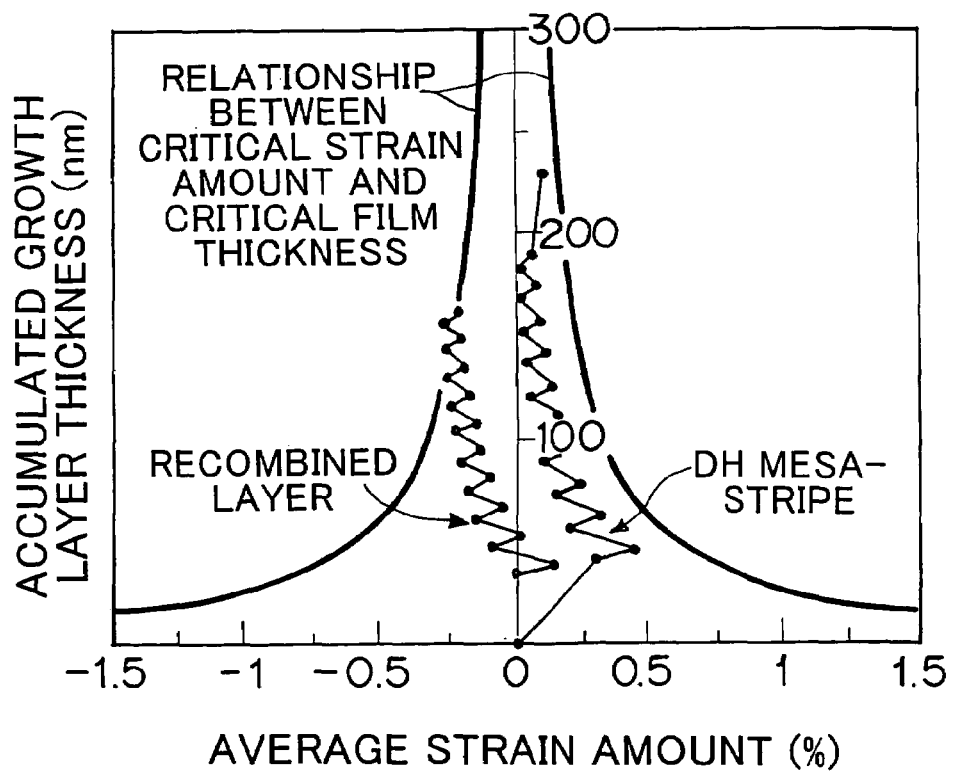
FIG. 6 is a calculation result showing a relationship between an average strain amount of a strained growth layer and a growth layer thickness with respect to a DH mesa-stripe and a recombination layer of a broad portion in the second embodiment of the present invention.

FIG. 6 is a calculation result showing a relationship between an average strain amount of a strained growth layer and a growth layer thickness with respect to a DH mesa-stripe and a recombination layer in the second embodiment. In the second embodiment, in the DH mesa-stripe 6, the optical confinement layers 2a and 4a, the well layer, and the barrier layer are strained growth layers. In the recombination layer, the optical confinement layers 2a and 4a of the DH mesa-stripe 6 and the semiconductor layers corresponding to the well layer and the barrier layer are strained growth layers.

As shown in FIG. 6, the average strain amount $\epsilon$ 1 (average) of the DH mesa-stripe and the average strain amount $\epsilon$2 (average) of the recombination layer 16 shift to the compression-strain side by the compressive strain given to the optical confinement in comparison with the structure shown in FIG. 4. As a result, it is understood that both the average strain amounts are the critical strain amount or less.

Figure 7:
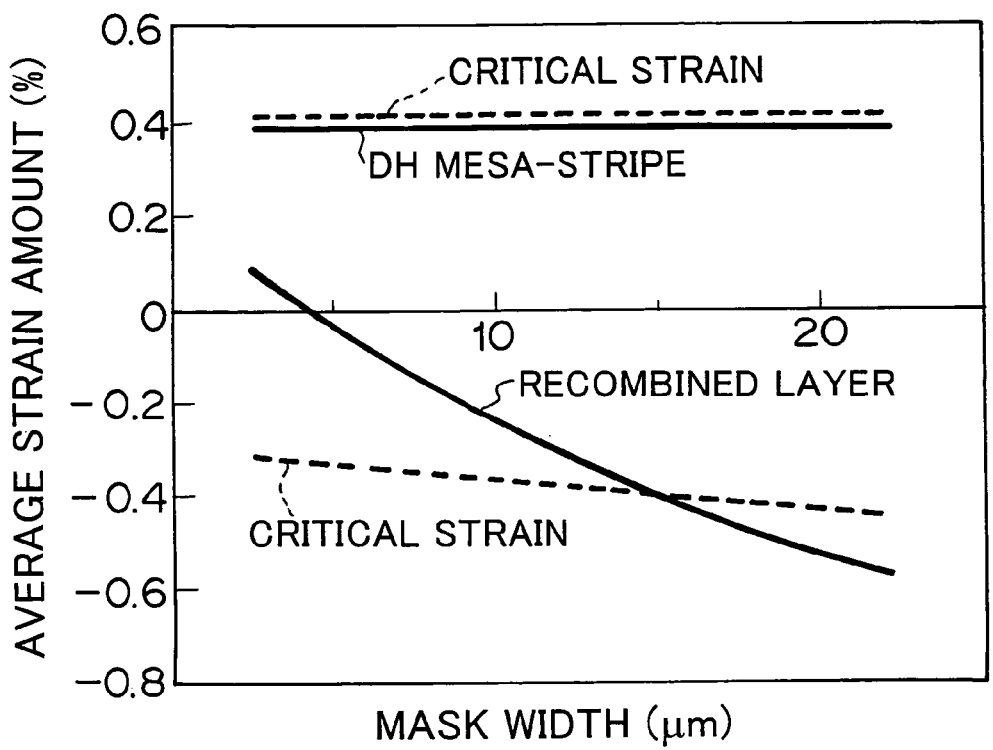
FIG. 7 is a calculation result showing dielectric mask width (distance between a narrow portion and a broad portion) dependency of average strain amounts in the DH mesa-stripe and the recombination layer.
Figure 8:
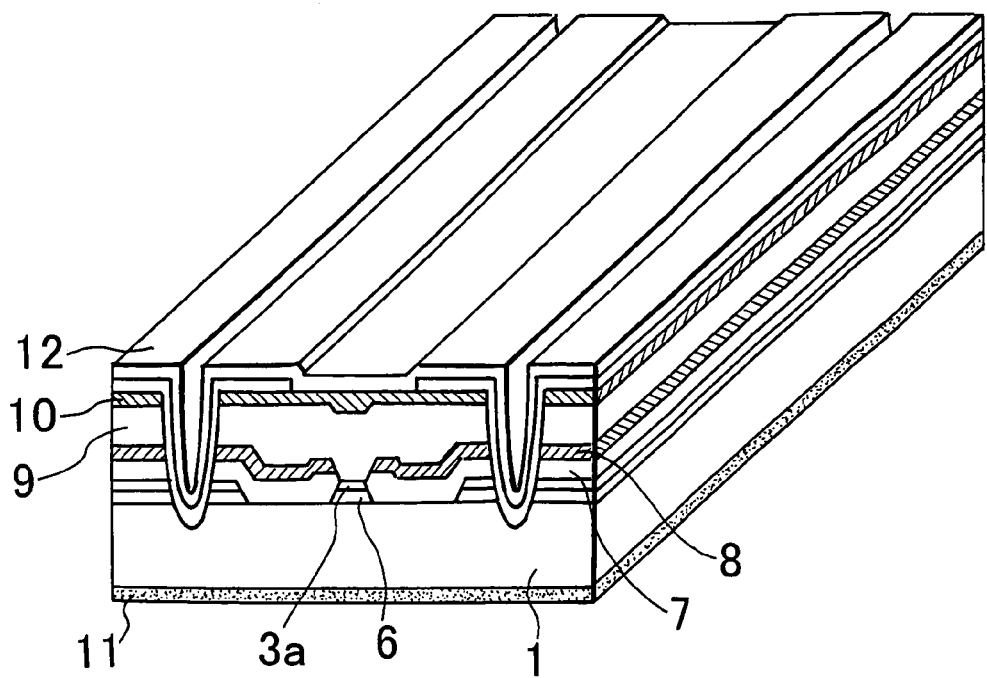
FIG. 8 is a cross-sectional structural diagram of an ASM-LD described in Non-patent Document 4.
Figure 9A:
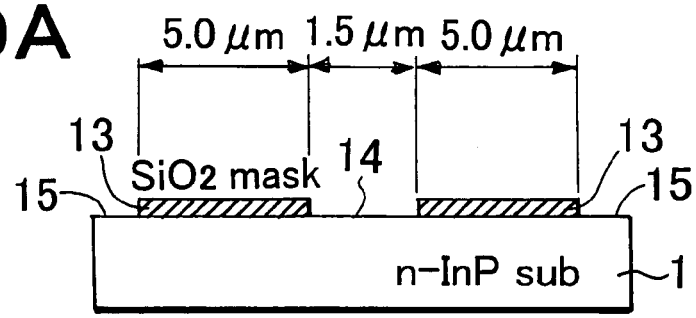
FIG. 9 includes process diagrams showing a method of manufacturing an ASM-LD described in Non-Patent Document 4.
Figure 9B:
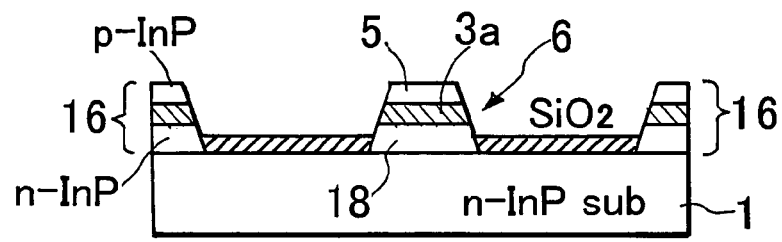
Figure 9C:
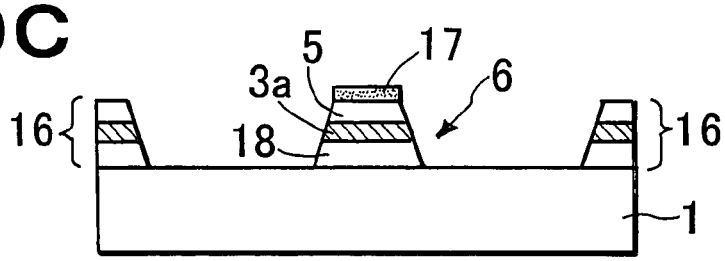
Figure 9D:
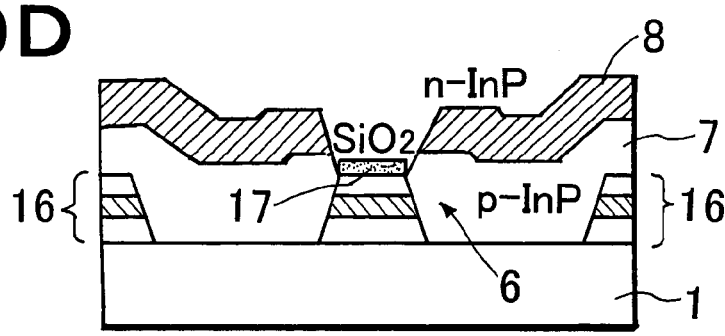
Figure 9E:
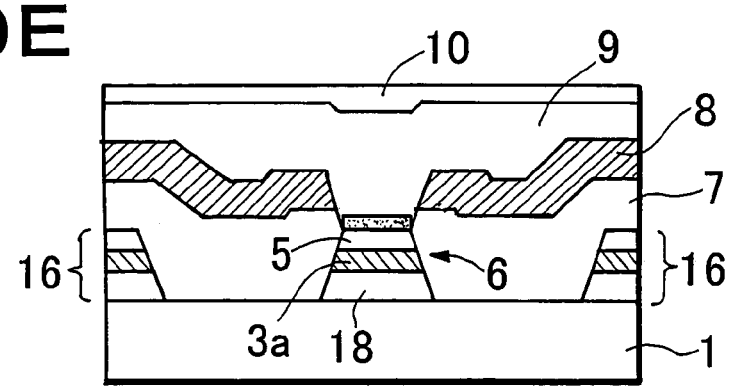

FIG. 7 shows a dependency of average strain amounts in the DH mesa-stripe and the recombination layer on a width (distance between the narrow portion and the broad portion) of the dielectric mask having an average strain amount. Growth conditions of the optical confinement layer and the strain-compensation type quantum well active layer in the DH mesa-stripe are adjusted such that the strain amounts and the thicknesses of these layers do not change even though the mask width is changed. As a structure of the active layer, the well layer has a thickness of 4 nm and a compression strain of 1.4%, and seven wells, and the barrier layer has a thickness of 8 nm and a tensile strain of −0.2%. This structure has an average strain amount of 0.389% which is approximate to a critical strain of 0.414%. The AlGaInAs optical confinement layer has a thickness of 20 nm.

As shown in FIG. 7, as the mask width increases, the average strain amount of the recombination layer shifts to a tensile-strain side. As a result, when the mask widths exceed 15 μm, the average strain amount of the recombination layer exceeds the critical strain amount, lattice relaxation may occur. Therefore, the mask width of a dielectric material used in selective growth is desirably larger than 0 and equal to or smaller than 15 μm.

The result in FIG. 7 will be described below in detail. When growth is performed under the same growth conditions, an In composition of the AlGaInAs layer (optical confinement layer, well layer, and barrier layer) grown on the narrow portion 14 increases as the mask width increases, and a compressive strain amount increases. An increasing rate of In growing species supplied by (2) gaseous diffusion in a horizontal direction and (3) migration of growing species from a dielectric mask surface is higher than that of Al or Ga growing species. On the other hand, in the recombination layer 16 to be grown into the broad portion 15, growing species are supplied by (1) gaseous diffusion in a vertical direction. For this reason, the growth conditions are not changed; the same growth layers are laminated without being dependent on the mask width. Therefore, in order to make a strain amount of a DH stripe grown on the narrow portion 14 constant without being dependent on the mask width, the strain amount of the recombination layer 16 must be set to a tensile strain side by adjusting the growth conditions. As a result, the relationship as shown in FIG. 7 is obtained.

In FIG. 7, in a region in which a mask width is 4 μm or less, the recombined layer is also compressively strained. This is dependent on the structure of the DH mesa-stripe to be grown. However, since the compressive strain amount is equal to or smaller than the compressive strain amount of the DH mesa stripe and a critical strain amount, the compression strain does not pose a problem.

Figure 10:
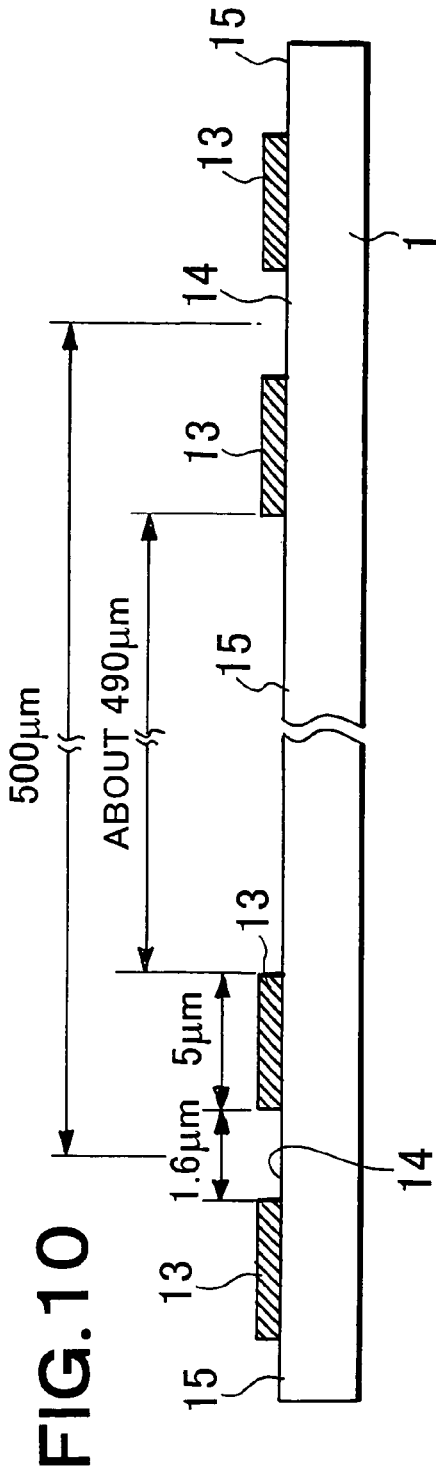
FIG. 10 is a schematic diagram showing a relationship between a narrow portion and a broad portion.
Figure 11:
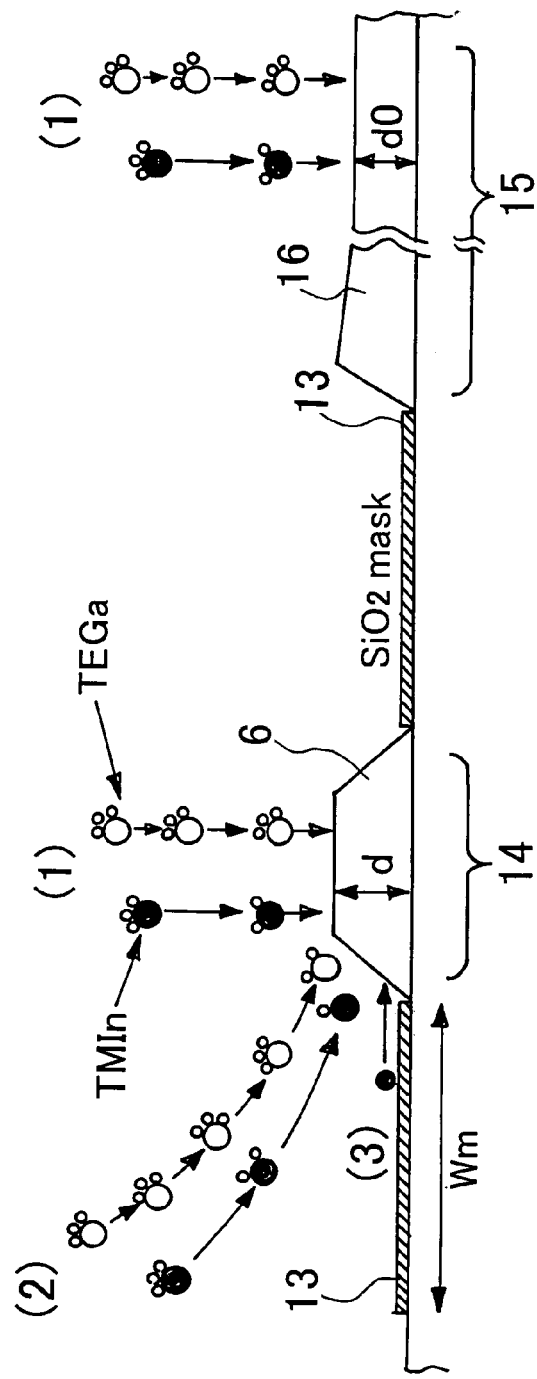
FIG. 11 is a schematic diagram showing a mechanism of selective growth described in Non-patent Document 5.

The present invention is particularly effective in a growth system containing Al and In such as AlInAs or AlGaInAs. This is because, in the growth mechanism shown in FIG. 10, a difference between the increasing rate of the In growth species supplied by (2) the gaseous diffusion in the horizontal direction and (3) the migration of growing species from the dielectric mask surface and the increasing rate of the Al species is specially large.

REFERENCE SYMBOLS

1 . . . N-type InP substrate 1
2 . . . N-type AlGaInAs optical confinement layer
2a . . . N-type AlGaInAs strained optical confinement layer
3 . . . Strain-compensation type multiple quantum well active layer
3a . . . Strained multiple quantum well active layer
4 . . . P-type AlGaInAs optical confinement layer
4a . . . P-type AlGaInAs strained optical confinement layer
5 . . . P-type InP cap layer
6 . . . DH mesa-stripe
7 . . . P-type InP current blocking layer
8 . . . N-type InP current blocking layer
9 . . . P-type InP cladding layer
10 . . . P-type InGaAs contact layer
11 . . . N-side electrode
12 . . . P-side electrode
13 . . . Silicon oxide mask
14 . . . Narrow portion
15 . . . Broad portion
16 . . . Recombination layer
17 . . . Silicon oxide mask

The invention claimed is:

1. A semiconductor layer having a double hetero mesa-stripe serving as a first semiconductor laminated product including at least a quantum well active layer formed by selective growth on a semiconductor substrate, and recombined layers serving as second semiconductor laminated products simultaneously formed on both the sides of the double hetero mesa-stripe at a predetermined interval in the selective growth, wherein when an average strain amount ϵ(average) and a critical strain amount ϵ(critical) are defined by the following equations:

$$\varepsilon(\text{average}) = \frac{\sum_{i=1}^{n}(\varepsilon i \times di)}{d} \qquad \text{[Equation 1]}$$

$$d = \sum_{i=1}^{n} di$$

where the number of strained semiconductor layers is represented by j, the number of unstrained semiconductor layers sandwiched by the strained semiconductor layers is represented by k, and a strain amount of an i-th semiconductor layer and a thickness of the i-th semiconductor layer in the double hetero mesa-stripe or the recombination layers obtained by laminating n (n=j+k) semiconductor layers are represented by ϵi and di, respectively, $$\varepsilon(\text{critical}) = \frac{b}{4\pi d(\text{critical})} \cdot \frac{1 - p \cdot (\cos\alpha)^{\wedge}2)}{(1+p) \cdot \cos\lambda} \cdot \left\{ \ln\left(\frac{d(\text{critical})}{b}\right) + 1 \right\} \qquad \{\text{Equation 2}]$$

where
- b: Strength of Burgers vector,
- p: Poisson's ratio
- α: angle between a dislocation line and its Burgers vector
- λ: angle between a slip direction and a direction perpendicular to cross lines of a slip surface and a laminate surface and being in the laminate surface,
- an average strain amount ϵ1(average) of the double hetero mesa-stripe is a compression strain (ϵ1(critical)≧ϵ1(average)>0, and
- an average strain amount ϵ2(average) of the recombination layer is a tensile strain (−ϵ2(critical)≦ϵ2(average)<0) not more than a critical strain amount ϵ2 (critical) or zero strain (ϵ2(average)=0).

2. The semiconductor laser according to claim 1, wherein the double hetero mesa-stripe includes at least an optical confinement layer and a quantum well active layer.

3. The semiconductor laser according to claim 1, wherein the double hetero mesa-stripe contains AlInAs or AlGaInAs.

4. The semiconductor laser according to claim 2, wherein the double hetero mesa-stripe contains AlInAs or AlGaInAs.

5. The semiconductor laser according to claim 1, wherein a distance between the double hetero mesa-stripe and the recombination layer is 15 μm or less.

6. A method of manufacturing a semiconductor laser comprising:
- forming a pair of stripe-shaped dielectric masks on a semiconductor substrate; and
- forming a double hetero mesa-stripe serving as a first semiconductor laminated product including an active layer in a narrow portion sandwiched by the dielectric masks; and the step of, at the same time, forming recombination layers serving as second semiconductor laminated products in broad portions on both the outsides of the dielectric masks, wherein when an average strain amount ϵ(average) and a critical strain amount ϵ(critical) are defined by the following equations:

$$\varepsilon(\text{average}) = \frac{\sum_{i=1}^{n}(\varepsilon i \times di)}{d} \qquad \text{[Equation 3]}$$

$$d = \sum_{i=1}^{n} di$$

where the number of strained semiconductor layers is represented by j, the number of unstrained semiconductor layers sandwiched by the strained semiconductor layers is represented by k, and a strain amount of an i-th semiconductor layer and a thickness of the i-th semiconductor layer in the double hetero mesa-stripe or the recombination layers obtained by laminating n (n=j+k) semiconductor layers are represented by ϵi and di, respectively, $$\varepsilon(\text{critical}) = \frac{b}{4\pi d(\text{critical})} \cdot \frac{1 - p \cdot (\cos\alpha)^{\wedge}2)}{(1+p) \cdot \cos\lambda} \cdot \left\{ \ln\left(\frac{d(\text{critical})}{b}\right) + 1 \right\} \qquad \{\text{Equation 4}]$$

where
- b: Strength of Burgers vector,
- p: Poisson's ratio
- α: angle between a dislocation line and its Burgers vector
- λ: angle between a slip direction and a direction perpendicular to cross lines of a slip surface and a laminate surface and being in the laminate surface,
- an average strain amount ϵ1(average) of the double hetero mesa-stripe is a compression strain (ϵ1(critical)≧ϵ1(average)>0, and
- an average strain amount ϵ2(average) of the recombined layer is a tensile strain (−ϵ2(critical)≦ϵ2(average)<0) not more than a critical strain amount ϵ2(critical) or zero strain (ϵ2(average)=0).

7. The method of manufacturing a semiconductor laser according to claim 6, wherein the double hetero mesa-stripe includes at least an optical confinement layer and a quantum well active layer.

8. The method of manufacturing a semiconductor laser according to claim 7, wherein the double hetero mesa-stripe contains AlInAs or AlGaInAs.

9. The method of manufacturing a semiconductor laser according to claim 7, wherein the double hetero mesa-stripe contains AlInAs or AlGaInAs.

10. The method of manufacturing a semiconductor laser according to claim 6, wherein a distance between the double hetero mesa-stripe and the recombination layer is larger than 0 and not more than 15 μm.

11. The semiconductor laser according to claim 1, wherein the double hetero mesa-stripe comprises:
- a first optical confinement layer;
- the quantum well active layer on the first optical confinement layer;
- a second optical confinement layer on the quantum well layer; and a cap layer on the second optical confinement layer.

12. The semiconductor laser according to claim 11, wherein
the first optical confinement layer comprises n-type AlGaInAs,
the second optical confinement layer comprises p-type AlGaInAs, and
the cap layer comprises InP.

13. The semiconductor laser according to claim 1, wherein a p-type InP current blocking layer is provided only on both sides of the double hetero mesa-stripe, and a p-type cladding layer is formed above the double hetero mesa-stripe.

14. The method of manufacturing a semiconductor laser according to claim 6, wherein the double hetero mesa-stripe comprises:
a first optical confinement layer;
the quantum well active layer on the first optical confinement layer;
a second optical confinement layer on the quantum well layer; and
a cap layer on the second optical confinement layer.

15. The method of manufacturing a semiconductor laser according to claim 6, wherein
the first optical confinement layer comprises n-type AlGaInAs,
the second optical confinement layer comprises p-type AlGaInAs, and
the cap layer comprises InP.

16. The method of manufacturing a semiconductor laser according to claim 6, wherein a p-type InP current blocking layer is provided only on both sides of the double hetero mesa-stripe, and a p-type cladding layer is formed above the double hetero mesa-stripe.

17. The semiconductor laser according to claim 1, wherein the average strain amount $\epsilon 1(average)$ of the double hetero mesa-stripe is shifted to a compression-strain side within the critical strain amount $\epsilon(critical)$ to reduce the tensile strain amount $\epsilon 2(average)$ of the recombination layer.

18. The semiconductor laser according to claim 1, wherein the average strain amount $\epsilon 1(average)$ of the double hetero mesa-stripe and the average strain $\epsilon 2(average)$ of the recombination layer is shifted to a compression-strain side by compressive strain given to optical confinement, both the $\epsilon 1(average)$ of the double hetero mesa-stripe and the average strain $\epsilon 2(average)$ of the recombination layer are the critical strain amount $\epsilon(critical)$ or less.

19. The method of manufacturing a semiconductor laser according to claim 6, wherein the average strain amount $\epsilon 1(average)$ of the double hetero mesa-stripe is shifted to a compression-strain side within the critical strain amount $\epsilon(critical)$ to reduce the tensile strain amount $\epsilon 2(average)$ of the recombination layer.

20. The method of manufacturing a semiconductor laser according to claim 6, wherein the average strain amount $\epsilon 1(average)$ of the double hetero mesa-stripe and the average strain $\epsilon 2(average)$ of the recombination layer is shifted to a compression-strain side by compressive strain given to optical confinement, both the $\epsilon 1(average)$ of the double hetero mesa-stripe and the average strain $\epsilon 2(average)$ of the recombination layer are the critical strain amount $\epsilon(critical)$ or less.

* * * * *